United States Patent [19]

Trussell

[11] Patent Number: 5,001,719
[45] Date of Patent: Mar. 19, 1991

[54] LASER DIODE ARRAY

[75] Inventor: Ward Trussell, Woodbridge, Va.

[73] Assignee: The United States of America as represented by the Secretary of the Army, Washington, D.C.

[21] Appl. No.: 439,909

[22] Filed: Nov. 21, 1989

[51] Int. Cl.$^5$ ............................................... H01S 3/19
[52] U.S. Cl. ........................................ 372/50; 372/43; 372/99
[58] Field of Search ................. 372/50, 43, 44, 49, 372/99

[56] References Cited

U.S. PATENT DOCUMENTS 4,718,070  1/1988  Liau et al. ............................. 372/50
4,719,635  1/1988  Yeh .......................................... 372/50

Primary Examiner—Georgia Epps
Attorney, Agent, or Firm—Milton W. Lee; John E. Holford; Anthony T. Lane

[57] ABSTRACT

The invention provides an array wherein thin laser diodes are mounted with their broad surfaces in intimate contact with a planer heat input surface of a heat sink; the laser radiation emerges from two opposite ends of the diodes parallel to the heat input surface, to provide more efficient lasing and faster uniform dissipation of heat; and elongated inverted V-shaped cross-section mirrors redirect the radiation into a single combined beam substantially normal to the heat input surface.

3 Claims, 2 Drawing Sheets

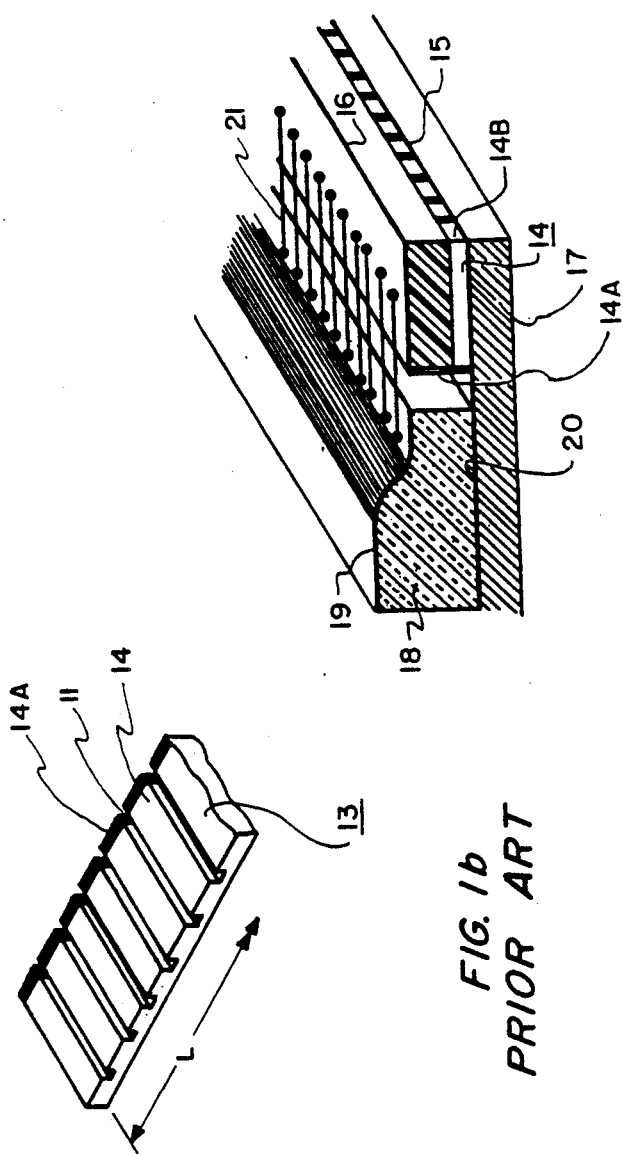
FIG. 1c PRIOR ART
FIG. 1b PRIOR ART
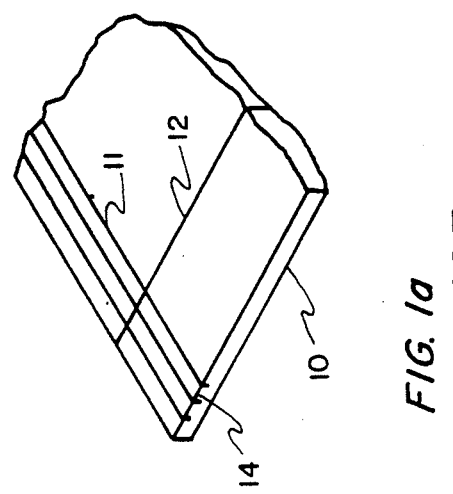
FIG. 1a PRIOR ART

LASER DIODE ARRAY

The invention described herein may be manufactured, used, and licensed by the U.S. Government for governmental purposes without the payment of any royalties thereon.

BACKGROUND OF INVENTION

1. Field—The invention relates to medium power near infrared diode lasers, for example, as used in light pumps for Nd:YAG type near infrared lasers.

2. Prior Art—in order to produce a compact pump for a near infrared laser, the pump having a well collimated infrared (IR) beam of substantial cross-section and power density; it has been the practice to mount a plurality of planar diodes parallel to and near edge of a fin-like heat sink member. The diodes are made long and narrow to direct lasing along a preferred axis. One end is coated with a multilayer dielectric mirror to direct the laser output in one direction along preferred axis. The diodes are aligned so that the output beams are parallel and normal to the edge. The diodes on each heat sink are connected in parallel and the sink-diode structures stacked in series to provide a compact two dimensional array and such that the small current and voltage requirements of each diode are multiplied to better match the characteristics of existing power supplies.

The above arrangement has a number disadvantages. The multilayered mirror is expensive and difficult to manufacture. The diode is capable of only about half the peak power as when emission is permitted from both small ends or facets, since the power per facet is limited by catastrophic degradation. The heat sink geometry produces a large temperature gradient between the emitting facet and the dielectric mirror placing undesirable stresses on the diode structure. An object of the present invention is to provide a more efficient arrangement which reduces the stress on the diodes and/or requires fewer diodes for the same output fluence.

BRIEF DESCRIPTION OF THE DRAWINGS

The invention is best understood with reference to the drawings wherein:

FIG. 1a shows a semiconductor, e.g. a gallium-alluminum-arsenide wafer with a plurality of laser stripes defined by stripes of oxides or similar means;

FIG. 1b shows a laser bar array sliced from the wafer of FIG. 1a;

FIG. 1c shows the bar array mounted on the edge of a thin heat sink;

DESCRIPTION OF THE PREFERRED EMBODIMENT

Figure 2:
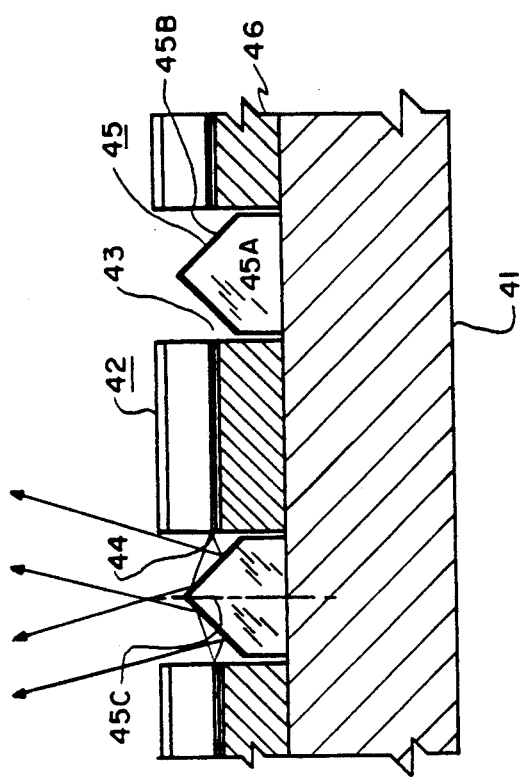
FIG. 2 shows a novel arrangement of laser diodes and roof shaped mirrors according to the present invention.

In FIG. 1a there is shown the general configuration of a gallium arsenide chip 10 from which the diodes are made. The diodes consist of a thin dielectric waveguiding structure or layer sandwiched between layers of n and p type material with electrodes plated on the exposed upper and lower broad surfaces. Various compositions and structures are described in the ELECTRONICS ENGINEERS' HANDBOOK, 2nd Edition, copyrighted 1982, by McGraw-Hill, pp 11-30 to 11-33. During processing the chip is divided into stripes by etching parallel grooves 11 of the order of a fraction of a millimeter spacing. The chip is then cleaved perpendicular to these grooves at parallel lines 12 separated by appropriate spacings, thus forming bars with numerous individual diode lasers 14.

As shown in FIG. 1b, one short back edge of the bar is treated to make it highly reflective, usually by adding a high reflectance dielectric coating 14A. The remaining short front edge is treated so that it reflects only a portion of the incident internal radiation, thus making the waveguide structure into Fabry-Perot cavities. A typical bar having a length L of one centimeter may be divided by the grooves into 20 or more laser diodes. The grooves are normally passivated by forming oxides on the exposed surfaces preferably filling the grooves.

As shown in FIG. 1c, the bars are plated with conductive electrodes 15 and 16 on the upper and lower faces. The electrodes 15 nearest the diodes is then soldered to a thin heat sink 17. The emiting facet 14B of each diode is coplanar with a thin edge of the heat sink to form one line of an array structure. Some arrays use only this simple structure, but one variation is to provide a beryllia bus bar 18 behind the mirror facets 14A. The bus bar is similarly plated to form top and bottom electrodes 19 and 20. The cross section of the bus bar tapers from a first portion away from the diodes which is thicker than the diodes to a second portion near the diodes about as thick as the diodes. The coplanar portions of the upper electrodes of the diodes and the bus bar are electrically connected by small wires 21 bridging the gap therebetween.

Figure 1D:
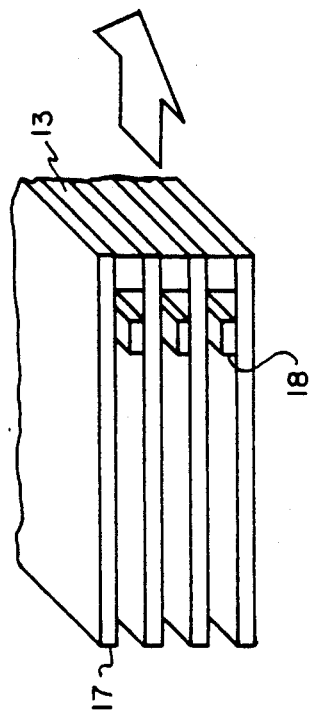
FIG. 1d shows a subarray formed by stacking a plurality of heat sink-bar array structures.

As shown in FIG. 1d, the above assemblies are next stacked to form a two dimensional array. The bottom of a heat sink contacts conductor 19 when the assemblies are soldered together, a final heat sink without diodes completes the array assembly. By thus connecting the diodes on each heat sink in parallel and the diode-sink assemblies in series the small voltage and current requirements of a single diode can be amplified to conventional power supply levels.

Figure 1E:
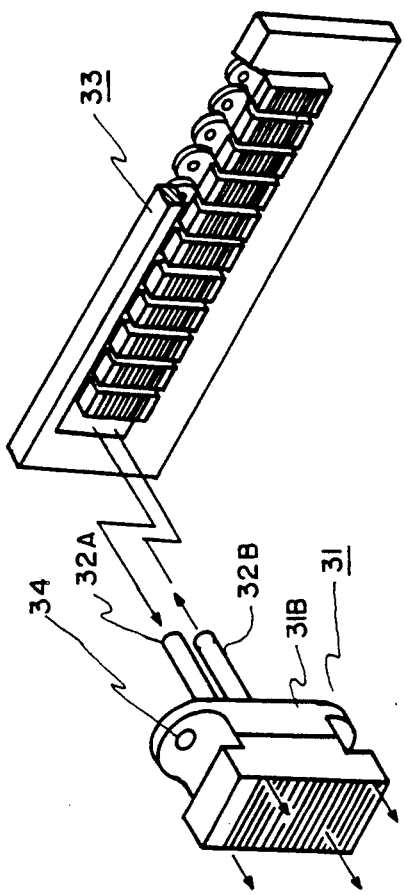
FIG. 1e shows a plurality of plug-in modules and mounting frame for combining a plurality of subarrays into a high intensity laser pump.

FIG. 1e shows a complete pump unit. The two dimensional arrays discussed above are formed into modules by mounting each of them in a metal module 31. The module have front and back sections which are bonded together to enclose all but the radiating facets of the diodes. Inside the module the conductors, such as 19 and 20 in FIG. 1c, are soldered to contacts which engage the prongs 32A and 32B on the back section 31B. The prongs may also serve as conduits for cooling fluid, if desired, or separate means for cooling may be provided. As the module is assembled the two section of each module are inserted in opposite sides of a frame member 33. Each module has a apertured mounting tab 34 at its top and bottom edge that mates with a threaded hole in frame 33, so that the back sections can be screwed firmly in place.

The improvement provided by the present invention is shown in FIG. 2. Instead of a plurality of thin heat sinks applicant uses a single thick sink 41. This is somewhat compensated by the fact that the bars of diodes 42 are now oriented so that their thinnest dimension is parallel to the radiation axis of the complete array module. Each diode is privided with radiation facets 43 and 44 at opposite ends, which eliminates the needs for coating 41A, previously described. Instead each facet has an antireflective dielectric filter coating which allows more of the radiation to escape and creates a more uniform heat flow pattern in the diode. To redirect the radiation perpendicular to the broad surface of the heat sink shaped reflector 45 is placed near each end facet of each diode. Most reflectors are between and serve two diodes. The reflectors may consist of glass fibers 45A, coated with a silver or aluminum elongated mirror of V-shaped cross-section 45B, the fibers stretching from one edge to an opposite edge of the sink surface with a roof shaped cross-section. The bars may include beryllia pedestals 46 to center radiation axis of the diode on the mirror and electrically insulate the lower diode electrodes from the heat sink. The pedestals, which are preferably slightly longer than the bars, are plated on the surfaces in contact with the diodes, the heat sink and the wiring between bars for easy soldering. For example, the exposed upper electrode of each bar may be wired to the exposed end of the electrode on the pedestal under the next bar on its right, leaving an unused electrode at the left and right for connection to prongs 32A and 32B in FIG. 1e. If desired, one fiber may be split in the plane of symmetry normal to FIG. 2 indicated by axis 45C to form the final edge reflectors instead of using two separates fibers. The fibers may be soldered in place or attached to the sink with a heat setting plastic. While the effective radiation areas are reduced, the increased efficiency due to decreased catastrophic degradation provides a more intense radiation.

The intensity at points in the output beam can be increased or decreased by varying the mirror surfaces from flat to a concave or convex configuration. The real payoff is a more reliable laser pump and a significant reduction in the number of diodes required to provide a given pump fluence, e.g. approximately half the number in the prior art system discussed above.

I claim:
1. A modular array of laser diodes comprising;
   a heat sink several orders of magnitude thicker than said laser diodes with a broad front surface;
   a two dimensional array of said laser diodes mounted to said front surface, each diode having opposed radiating facets at the ends so that at least one facet of each diode initially radiates toward the facet of another diode; and
   at least a symmetrical half of an elongated mirror of inverted V-shaped cross-section mounted on a fiber of material different from that in said diodes in the path of the radiations from every facet to redirect all of said radiations normal to said broad front surface.
2. A modular array according to claim 1 wherein:
   said fiber comprises a glass of five-sided cross-section coated with a metal reflector.
3. A modular array according to claim 1 wherein:
   said diodes are formed from gallium aluminum arsenide.

* * * * *